(12) United States Patent
Merugu et al.

(10) Patent No.: US 10,816,598 B1
(45) Date of Patent: Oct. 27, 2020

(54) DYNAMIC DEBUGGING OF CIRCUITS

(71) Applicant: Xilinx, Inc., San Jose, CA (US)

(72) Inventors: Ushasri Merugu, Hyderabad (IN);
Mahesh Sankroj, Secunderabad (IN);
Sharat Babu Kotamraju, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/148,371

(22) Filed: Oct. 1, 2018

(51) Int. Cl.
*G01R 31/317* (2006.01)
*G06F 1/08* (2006.01)
*G01R 31/3177* (2006.01)

(52) U.S. Cl.
CPC ... *G01R 31/31727* (2013.01); *G01R 31/3177* (2013.01); *G01R 31/31705* (2013.01); *G06F 1/08* (2013.01)

(58) Field of Classification Search
CPC ........ G01R 31/31727; G01R 31/31705; G01R 31/3177; G06F 1/08
See application file for complete search history.

(56) References Cited

U.S. PATENT DOCUMENTS 5,673,273 A * 9/1997 Almy ...................... G06F 11/27
327/286

6,389,558 B1 * 5/2002 Herrmann .......... G01R 31/3177
714/39
9,685,957 B2 * 6/2017 How ................... G06F 17/5054

FOREIGN PATENT DOCUMENTS

AU 2011299256 A1 * 2/2013 ....... G01R 31/31705

OTHER PUBLICATIONS

Khan, H., An Intrusive Dynamic Reconfigurable Cycle-Accurate Debugging System for Embedded Processors, Apr. 2018, Springer International Publishing, Applied Reconfigurable Computing, pp. 433-445 (Year: 2018).*
Xilinx Users Guide: RTL and Technology Schematic Viewers Tutorial—UG685 (v14.1) Apr. 24, 2012, Xilinx, Inc. (Year: 2012).*
Xilinx, "Integrated Logic Analyzer v6.2," LogiCORE IP Product Guide, Vivado Design Suite, Oct. 5, 2016, pp. 1-31, Xilinx, Inc., San Jose, California, USA.

* cited by examiner

*Primary Examiner* — April Y Blair
*Assistant Examiner* — Matthew W Wahlin
(74) *Attorney, Agent, or Firm* — Kevin T. Cuenot

(57) ABSTRACT

A system for debugging circuits includes an integrated circuit configured to implement a circuit under test and a logic analyzer controller coupled to the circuit under test. The system includes a host computing system configured to communicate with the logic analyzer controller and provide a debug command to the logic analyzer controller. The logic analyzer controller, in response to the debug command, controls operation of the circuit under test.

20 Claims, 9 Drawing Sheets

DYNAMIC DEBUGGING OF CIRCUITS

TECHNICAL FIELD

This disclosure relates to integrated circuits (ICs) and, more particularly, to debugging circuits implemented within an IC.

BACKGROUND

Debugging a circuit and/or circuit design can be a time-consuming endeavor. In the case of a circuit design intended for implementation within a programmable IC such as a field programmable gate array (FPGA), an in-circuit logic analyzer (logic analyzer) may be implemented within the IC with the circuit under test to capture the states of particular signals of interest. These signal states may be stored locally within internal memory of the IC and then offloaded to a host computing system for analysis. Operation of the logic analyzer is passive relative to the circuit under test. In other words, the functionality of the logic analyzer is limited to that of passively capturing and storing the states of selected signals for subsequent offline analysis.

Using the data collected from the logic analyzer, a designer can identify an error in the physical circuit and attempt to reproduce that error within a functional simulation of the circuit design. Modifications to the circuit design may be tested within the functional simulation to determine whether the error has been corrected. The modified circuit design, however, must be re-processed through a design flow involving synthesis, placement, and routing, for implementation within the IC for further testing. This process often takes many hours to complete without any assurance that the modification that fixed the error in the circuit design simulation will fix the error in the physical circuit. Appreciably, this process may be repeated as needed to continue debugging the error and/or other errors with each iteration taking hours and/or days to complete.

SUMMARY

In one or more embodiments, a system includes an IC configured to implement a circuit under test and a logic analyzer controller coupled to the circuit under test. The system includes a host computing system configured to communicate with the logic analyzer controller and provide a debug command to the logic analyzer controller. The logic analyzer controller, in response to the debug command, controls operation of the circuit under test.

In one or more embodiments, an IC includes a circuit under test and a logic analyzer controller coupled to the circuit under test. The logic analyzer controller is configured to receive a debug command from a host system and control operation of the circuit under test in response to the debug command.

In one or more embodiments, a method includes providing, within an IC, a circuit under test and a logic analyzer controller coupled to the circuit under test, receiving, by the logic analyzer controller, a debug command from a host system, and controlling, using the logic analyzer controller, operation of the circuit under test in response to the debug command.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
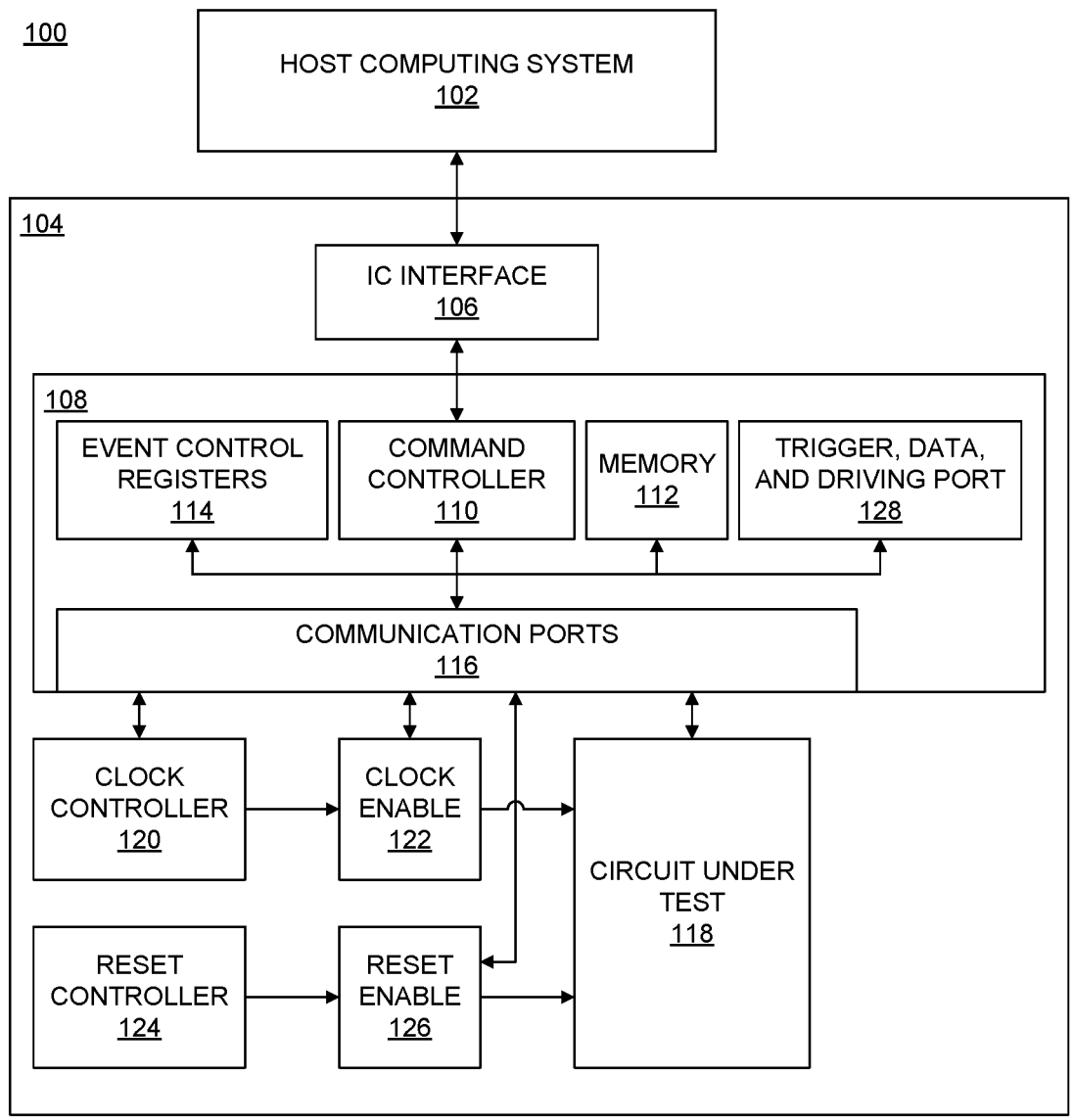
FIG. 1 illustrates an example debug system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to ICs and, more particularly, to debugging circuits implemented within an IC. In accordance with the inventive arrangements described within this disclosure, a debugging system is provided that allows a host computing system to control operation of a circuit under test for purposes of debugging. The inventive arrangements provide an efficient way of dynamically debugging a circuit. The circuit may be debugged through dynamical control of clock circuitry, dynamical control of reset circuitry, and/or dynamical injection of values onto selected data signals to reduce the iterative and time-consuming process of resynthesizing and re-implementing the circuit design. These operations can be initiated and controlled from a host computing system in real time or in substantially real time. Errors may be discovered and isolated by overriding the values of selected data signals while controlling the clocking and resets of the circuit under test.

The debugging system includes a host computing system coupled to an IC. The IC includes a logic analyzer (LA) controller and a circuit under test. The LA controller is coupled to the circuit under test. The host computing system is capable of issuing debug commands to the LA controller. In response to the debug commands, the LA controller is capable of generating one or more control signals that are provided to the circuit under test in real time, e.g., during runtime or operation of the circuit under test. The control signals control operation of the circuit under test.

In one or more embodiments, the LA controller, in response to one or more debug commands from the host computing system, is capable of controlling operation of clock circuitry and/or reset circuitry of the circuit under test. In one or more other embodiments, the LA controller, in response to one or more debug commands from the host computing system, is capable of driving, or injecting, values onto signals of the circuit under test selected for debugging. Accordingly, the LA controller is capable of stopping the clock signal, placing the circuit under test into known operating states, stepping the clock signal, and/or implementing more complex debug operations as described below.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is an example of a debug system 100. Debug system 100 includes a host computing system 102 and an IC 104. An example implementation of host computing system 102 is described in connection with FIG. 12. An example implementation of IC 104 is described in connection with FIG. 13. Though not illustrated in FIG. 1, IC 104 can be mounted on a circuit board with communication ports, memory, and/or connectors to facilitate communication with host computing system 102.

Host computing system 102 is implemented as a data processing system, e.g., a computer, that is capable of executing program code. In one or more embodiments, host computing system 102 is capable of executing an electronic design automation (EDA) application and/or a runtime analyzer application. Host computing system 102, in executing the EDA application, is capable of performing operations such as modifying circuit designs specified in a hardware description language, as a netlist, or other suitable format, and performing a design flow including operations such as synthesis, placement, routing, and/or configuration bitstream generation. Host computing system 102, in executing the EDA application and/or the runtime analyzer application, is further capable of downloading a configuration bitstream specifying a circuit design into IC 104 thereby causing the circuit design to be physically implemented within IC 104. In one or more embodiments, the runtime analyzer application is capable of communicating with IC 104 and, more particularly, with IC interface 106 over a communication link. In particular embodiments, the runtime analyzer application is provided as a component of the EDA application.

IC interface 106 can be implemented as any of a variety of different communication interfaces. Example implementations of IC interface 106 include, but are not limited to, a Joint Test Action Group (JTAG) interface, a Peripheral Component Interconnect Express (PCIe) interface, or other known communication interfaces including any of a variety of high speed interfaces. In one or more embodiments, IC interface 106 is implemented using programmable circuitry of IC 104. In one or more other embodiments, IC interface 106 is implemented as hardwired circuitry.

IC interface 106 is coupled to LA controller 108. In the example of FIG. 1, LA controller 108 includes a command controller 110, a memory 112, event control registers 114, a trigger, data, and driving port (TDD port) 128, and communication ports 116. In the example of FIG. 1, LA controller 108 is implemented within programmable circuitry of IC 104. For example, a designer, while working in the EDA application of host computing system 102, incorporates a core or other programmatic representation of LA controller 108 into a circuit design to be debugged. LA controller 108 is then processed through the design flow as part of the circuit design for implementation within IC 104.

IC interface 106 is coupled to command controller 110. Command controller 110 is capable of communicating with host computing system 102 via the communication link established with IC interface 106. For example, command controller 110 is capable of receiving debug commands from host computing system 102. In general, in response to received debug commands from host computing system 102, command controller 110 is capable of configuring or programming other blocks within LA controller 108 such as event control registers 114 and/or TDD port 128. In addition, command controller 110 is capable of generating control signals that are sent to other circuit blocks within IC 104 through communication ports 116. Event control registers 114 are also capable of generating control signals that are sent to other circuit blocks within IC 104 through communication ports 116. The control signals generated by command controller 110 and/or event control registers 114 are capable of controlling clock circuitry and reset circuitry of circuit under test 118. Control signals generated by command controller 110 and/or event control registers 114 are also capable of pushing particular values onto selected signals (e.g., data signals) of circuit under test 118 referred to herein as "debug signals". The debug signals are signals of circuit under test 118 selected by the user during the implementation process for debugging.

LA controller 108 is capable of sending data to host computing system 102. For example, values from signals of circuit under test 118 that are selected for data capture may be stored in memory 112. Within this disclosure, signals selected for data capture and/or monitoring by LA controller 108 for purposes of detecting user-specified events are referred to as "probed signals". The probed signals are selected by the user during implementation. The values captured from the probed signals may be referred to herein as "debug data". Within this disclosure, debug signals are considered probed signals since LA controller 108 is also capable of capturing values of debug signals as debug data. The debug data may be stored in memory 112. Command controller 110 is capable of reading the debug data from memory 112 and sending the debug data to host computing system 102.

As noted, memory 112 is capable of storing debug data from probed signals of circuit under test 118. For example, values of probed signals of circuit under test 118 that occur within a debug window (e.g., a time span) before and/or after a detected trigger condition, are stored within memory 112. In the example of FIG. 1, probed signals and/or debug signals of circuit under test 118 are coupled to communication ports 116 thereby allowing storage of values from the probed signals over time in memory 112. Further, LA controller 108 is capable of pushing values onto selected debug signals. In one or more embodiments, memory 112 is implemented using one or more block random access memories (BRAM) of IC 104.

TDD port 128 is capable of storing user-defined events. A user can define particular events in host computing system 102. These events can be provided from host computing system 102 to LA controller 108. For example, the user defined events can be provided from host computing system 102 to command controller 110 as one or more debug commands. Command controller 110 is capable of storing the user-defined events specified by the debug commands within TDD port 128. For example, a user working within the runtime analyzer application executed by host computing system 102 is capable of specifying one or more events. Signals of the circuit design implemented as circuit under test 118 may be displayed on a display device of host computing system 102. The user may create event(s) by selecting signals of interest (e.g., as probed and/or debug signals) of circuit under test 118. As part of the user defined event, the user may specify a function or expression of the selected signals, that, if met or true, means that the user defined event has occurred.

TDD port 128 receives probed signals from circuit under test 118 via communication ports 116. TDD port 128 is capable of monitoring the probed signals to determine whether a user-defined event has been detected. In response to detecting an occurrence of a user-defined event, TDD port 128 notifies event control registers 114.

Event control registers 114 are responsible for keeping track of, e.g., counting the occurrence of, the user defined events as detected by TDD port 128. In particular embodiments, event control registers 114 track how many times events defined in TDD port 128 are detected during operation of circuit under test 118. Event control registers 114, when armed, count the occurrence of the user-defined events within circuit under test 118. Event control registers 114 are capable of signaling TDD port 128 in response to the count of a particular event reaching a predetermined threshold. In one or more embodiments, TDD port 128 determines that a trigger condition has been detected in response to the signal from event control registers 114 and, in response, causes memory 112 to begin storing debug data. TDD port 128 is capable of generating write addresses for storing debug data in memory 112, write enabling memory 112, and discontinuing the storage of debug data after a predetermined amount of time (e.g., clock cycles) or amount of debug data has been stored as specified by the debug commands provided from host computing system 102.

As an illustrative and nonlimiting example, a user can specify an event such as the occurrence of a particular interrupt. In the current example, circuit under test 118 hangs after the occurrence of a seventh such interrupt. In this case, the user defines an event, e.g., the occurrence of the interrupt. Further, the user indicates that the trigger condition is the seventh occurrence of the interrupt. Host computing system 102 provides one or more debug commands to command controller 110 specifying such information.

Command controller 110 stores the user defined event, e.g., the occurrence of the particular interrupt signal, in TDD port 128. Command controller 110 stores the number of occurrences of the user-defined event, e.g., 7, in event control registers 114.

TDD port 128 monitors for the occurrence of the interrupt and notifies event control registers 114 of each occurrence of the event. Event control registers 114, once armed, begins counting the occurrence of the event based upon the notifications received from TDD port 128. In particular embodiments, command controller 110 is capable of arming, or enabling, event control registers 114 under control of host computing system 102. In response to detecting a seventh interrupt, event control registers 114 are capable of generating a signal to TDD port 128. In response to the signal from event control registers 114, TDD port 128 causes memory 112 to begin storing debug data. TDD port 128 is capable of discontinuing the storage of debug data based upon the conditions specified by the debug commands used to configure LA controller 108. In another example, TDD port 128 may continually store debug data in memory 112 (e.g., overwriting data) and discontinue storing data in response to the signal from event control registers 114 indicating the seventh occurrence of the interrupt signal.

Circuit under test 118 is a physical implementation of a user circuit design. As noted, a user may choose to incorporate LA controller 108 into a circuit design. Using the EDA application, the circuit design, including a core or other description of LA controller 108, is processed through a design flow that involves synthesis, placement, routing, and configuration bitstream generation. The resulting configuration bitstream is loaded into IC 104 to implement the architecture illustrated in FIG. 1. In this regard, circuit under test 118 is implemented using programmable circuitry of IC 104 and/or a combination of programmable circuitry and one or more hard circuit blocks (which may be configurable by the configuration bitstream).

As part of the design flow, when LA controller 108 is incorporated into the user's circuit design, the EDA application is capable of modifying the user circuit design to accommodate LA controller 108. The EDA application, for example, adds additional circuitry to the circuit design that interfaces LA controller 108 to circuit under test 118. As discussed, probed signals of the user's circuit design (e.g., circuit under test 118) are coupled to communication ports 116. Debug signals of the user's circuit design are coupled to communication ports 116. Debug signals are processed by the EDA application to add circuitry that allows LA controller 108 to push or inject values onto the debug signals of circuit under test 118. The injected values effectively override or overwrite previous values on the debug signals. The EDA application further adds circuitry allowing LA controller 108 to control aspects of circuit under test 118 such as clocking and resets. These operations may be performed during operation of circuit under test 118 under control of host computing system 102, e.g., in response to commands provided to LA controller 108 from host computing system 102.

In the example of FIG. 1, clock controller 120 is implemented as a hardwired circuit block within IC 104. Clock controller 120 is capable of providing one or more different clock signals to different circuits and/or clock domains in IC 104. As part of the design flow, host computing system 102 is capable of coupling ports of clock controller 120 to communication ports 116 of LA controller 108. As such, LA controller 108 is capable of controlling clock controller 120 and changing or modifying properties of clocks signals generated by clock controller 120. For example, LA controller 108 is capable of controlling clock controller 120 to change frequencies of clock signals generated by clock controller 120 during operation of IC 104 and/or circuit under test 118.

For example, as part of the design flow, host computing system 102, in executing the EDA application, is capable of generating clock enable 122. Clock enable 122 is a circuit block coupled to LA controller 108, clock controller 120, and circuit under test 118. Clock enable 122 is controlled via one or more control signals provided from command controller 110 to control one or more different properties of the clock signal(s) provided to circuit under test 118 from clock controller 120.

In one or more embodiments, host computing system 102 is capable of accessing a Dynamic Reconfiguration Port (DRP) of IC 104 to configure, dynamically during operation of IC 104, clock controller 120. For example, command controller 110 may be coupled to the DRP via communication ports 116. Command controller 110, in response to debug commands from host computing system 102, is capable of generating one or more control signals to the DRP to dynamically control operation of clock controller 120. Command controller 110, using the DRP, is capable of changing the frequency of clock signals generated by clock controller 120 dynamically during operation of IC 104 and circuit under test 118.

In the example of FIG. 1, host computing system 102, in executing the EDA application, is also capable of generating reset enable 126. Reset enable 126 is a circuit block coupled to reset controller 124, circuit under test 118, and LA controller 108. Reset enable 126 is controlled via control signals provided from LA controller 108 to control one or more different aspects of the reset signal(s) provided to circuit under test 118 from reset controller 124.

Reset enable 126 is capable of operating on a per module or per sub-module basis for circuit under test 118. Circuit under test 118 has a defined hierarchy of hardware modules. In one or more embodiments, reset enable 126 is capable of controlling the reset signal provided to selected ones of the modules (or sub-modules) of the hierarchy of circuit under test 118. This allows reset enable 126 to reset only those portions (e.g., particular modules) of circuit under test 118 that are specified by debug commands received from host computing system 102. The debug commands, for example, may specify particular modules. LA controller 108 is capable of generating control signal(s), in response to the debug commands, to reset enable 126 so that only the particular modules specified in the debug commands are reset.

In the example of FIG. 1, reset controller 124, though shown separately from circuit under test 118, is a circuit block that is considered part of circuit under test 118 (e.g., exists within circuit block 118 prior to modification thereof for debugging). In this regard, the EDA application adds reset enable 126 and clock enable 122 to circuit under test 118. For example, the EDA application effectively instruments the user's circuit design by adding LA controller 108 and incorporating reset enable 126, clock enable 122, and the connectivity described with reference to FIG. 1 within circuit under test 118.

For purposes of illustration, host computing system 102 is described as being capable of executing both an EDA application and a runtime analysis application. In one or more other embodiments, more than one host computing system may be used. In that case, for example, a first host computing system executes the EDA application and performs the design flow. A second and different host computing system executes the runtime analyzer application and is used to debug circuitry once implemented within IC 104.

Figure 2:
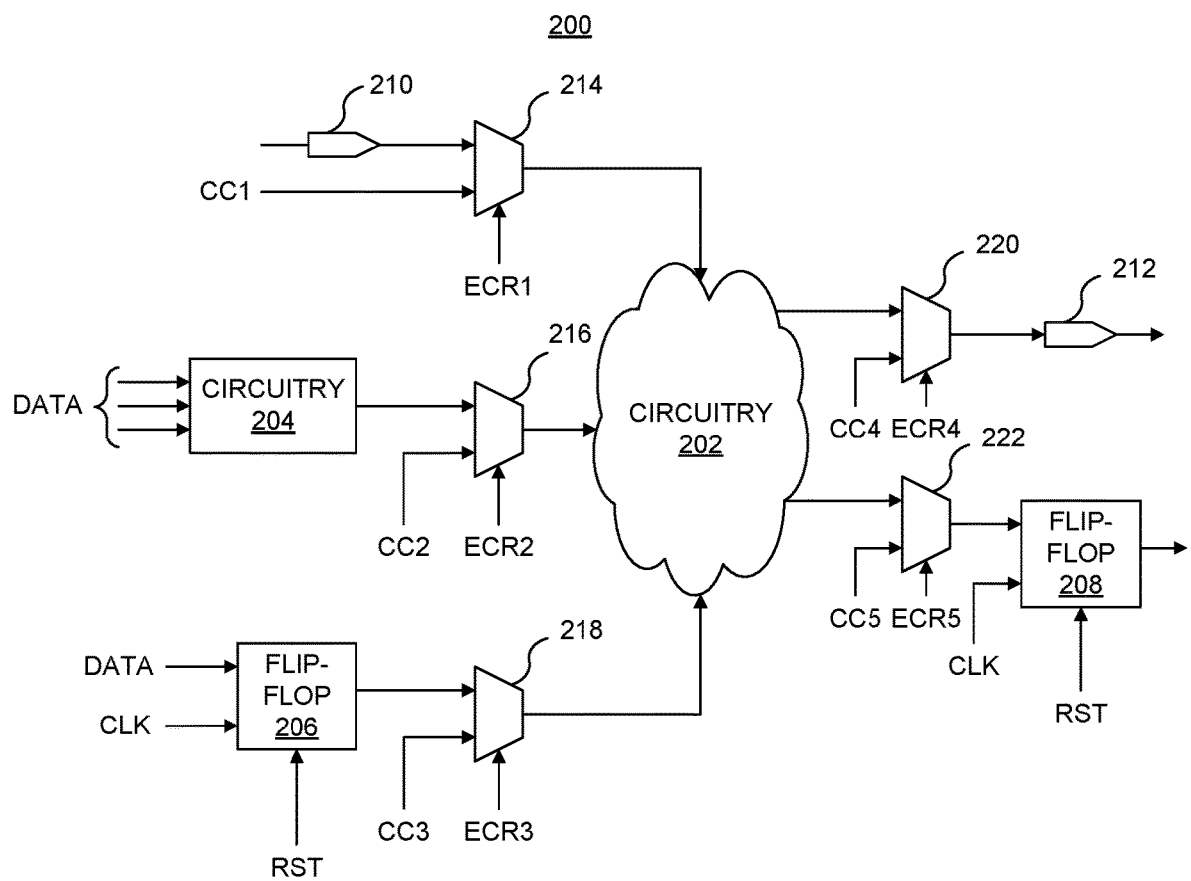
FIG. 2 illustrates an example circuit under test modified for use with a logic analyzer controller.

FIG. 2 is an example circuit under test 200 modified for use with LA controller 108 of FIG. 1. Circuit under test 200 is an example implementation of circuit under test 118 of FIG. 1. Circuit under test 200, prior to modification for debugging, includes circuitry 202, circuitry 204, flip-flop 206, and flip-flop 208. Circuit under test 200 further includes a primary input 210 and a primary output 212. Circuitry 202 and 204 represent any of a variety of user specified circuitry or logic. For example, circuitry 202 and circuitry 204 represent circuit blocks such as one or more of combinatorial logic, lookup tables (LUTs), and/or hard circuit blocks that may be included in IC 104. In other embodiments, circuitry 202 and 204 may be implemented as any of the circuit blocks, tiles, or elements available within IC 104.

FIG. 2 illustrates the additional circuitry included by host computing system 102 to interface LA controller 108 to circuit under test 200. This additional circuitry allows LA controller 108 to control different aspects of circuit under test 200. For example, the EDA system operating on the circuit design corresponding to circuit under test 200 and instrumenting the circuit design to add multiplexers 214, 216, 218, 220, and 222. Prior to modification, outputs from primary input 210, circuitry 204, and flip-flop 206, were directly coupled to circuitry 202. Similarly, inputs of primary output 212 and flip-flop 208 were directly coupled to circuitry 202. In the example of FIG. 2, the user has, using the EDA application, selected the outputs of primary input 210, circuitry 204, and flip-flop 206 to be debug signals. Similarly, the user selected the outputs from circuitry 202 to be debug signals. As such, host computing system 102 has added, in addition to LA controller 108, the additional circuitry 214, 216, 218, 220, and 222.

In one or more embodiments, alternative and available switching circuits are used to implement multiplexers to perform the operations described herein. Such circuits, whether multiplexers or other alternative circuits, can be implemented using programmable circuitry (e.g., one or more programmable circuit blocks) as described herein in connection with FIG. 13.

FIG. 2 also illustrates the control signals provided to circuit elements of circuit under test 200 and to the added circuitry. Referring to flip-flops 206 and 208, whereas the reset (RST) signals were originally provided by reset controller 124, after modification, the reset signals are provided by reset enable 126. As noted, reset enable 126 operates under control of LA controller 108. Similarly, whereas the clock (CLK) signals were originally provided by clock controller 120, after modification, the clock signals are provided by clock enable 122. As noted, clock enable 122 operates under control of LA controller 108.

The select signals labeled "ECRn" provided to each of multiplexers 214, 216, 218, 220, and 222 are provided from event control registers 114 via communication ports 116. In the example of FIG. 2, each of multiplexers 214-222 receives a first input signal from an original circuit element of circuit under test 200 and a second input signal labeled "CCn" that is provided from command controller 110. Command controller 110 is capable of providing values to each of multiplexers 214-222. Based upon the ECR select signals, multiplexers 214-222 are capable of passing the original signal coupled to the first input or the signal specified by command controller 110 coupled to the second input. In this way, command controller 110 is able to push values specified by a user through host computing system 102 onto data signals of circuit under test 200.

In the example diagrams of circuits under test provided within this disclosure, signal labels such as "CC", "ECR", "CLK", and "RST" are used to illustrate signals including control signals from command controller 110, event control registers 114, clock signals controlled by LA controller 108 (from clock enable 122), and reset signals controlled by LA controller 108 (from reset enable 126), respectively. It should be appreciated that while a given label may be used for more than one signal, each instance of the signal within the figure may have a different and/or independent value. For example, the CC1 signal provided to multiplexer 214 is independent of the CC2 signal provided to multiplexer 216. As such, the value of the CC1 signal provided to multiplexer 214 may differ from the value of the CC2 signal provided to multiplexer 216 depending upon the particular debug commands being executed by LA controller 108.

Figure 3:
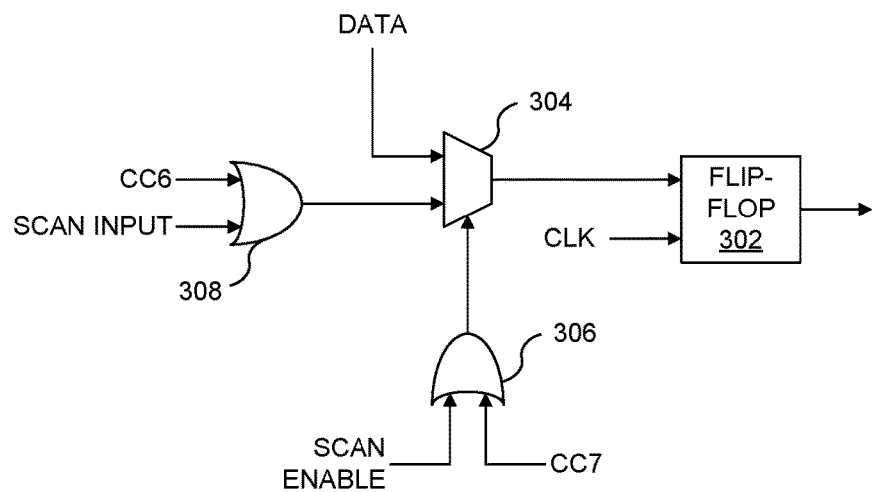
FIG. 3 illustrates an example implementation of a flip-flop of a circuit under test modified for use with a logic analyzer controller.

FIG. 3 is an example implementation of a flip-flop 302 of a circuit under test modified for use with LA controller 108 of FIG. 1. The example of FIG. 3 illustrates an implementation of a flip-flop configured for scan path testing as implemented within IC 104. Prior to modification, multiplexer 304 has a first input coupled to a data signal and a second input coupled to a scan input signal. The scan input signal is coupled directly to the second input of multiplexer 304. Further, the scan enable signal is coupled directly to multiplexer 304 as the select signal. In such an arrangement, flip-flop 302 receives a signal output from multiplexer 304. Multiplexer 304 passes the data signal or the scan input signal to flip-flop 302 based upon the state of the scan enable signal provided thereto as the select signal.

In implementing a user circuit design for debugging, host computing system 102 is capable of modifying flip-flops corresponding to signals selected as debug signals as illustrated in FIG. 3. In one or more embodiments, host computing system 102 inserts OR gate 306 and OR gate 308 into the circuit design. OR gate 306 is capable of performing a logical OR operation of the scan enable signal and a control signal labeled "CC7" from command controller 110. Similarly, OR gate 308 is capable of performing a logical OR operation of the scan input signal and the control signal labeled "CC6" from command controller 110. Since scan path testing and debugging operations are not performed concurrently using IC 104, the available inputs for performing scan path testing may be modified as shown with OR gates allowing such inputs to also be used for purposes of debugging and injecting values from LA controller 108 onto the data signals of the circuit under test, which effectively overwrite and prior values on such signals.

Using the architecture illustrated in FIG. 3, a user using the runtime analyzer application executed by host computing system 102 is able to drive data onto any of the signals of the circuit under test selected for debugging in real time or in substantially real time. For example, in cases where an error is detected in circuit under test 200, rather than re-implementing circuit under test 200, a desired or correct value may be injected onto one or more data signals so that continued monitoring, analysis, and/or debugging of circuit under test 200 may continue.

Figure 4:
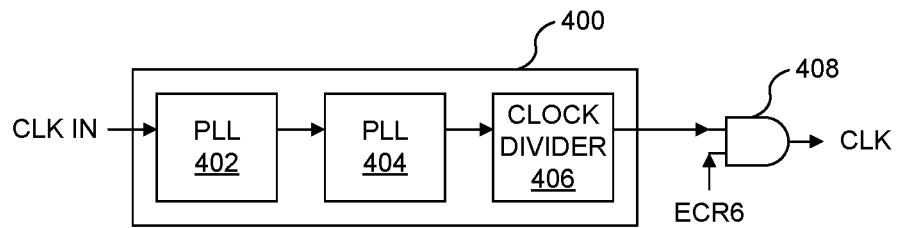
FIG. 4 illustrates an example of clock circuitry of a circuit under test modified for use with a logic analyzer controller.

FIG. 4 is an example of clock circuitry of the circuit under test modified for use with LA controller 108 of FIG. 1. In the example of FIG. 4, a clock controller 400 is illustrated. For purposes of illustration, clock controller 400 includes a phase-locked loop (PLL) 402 that receives an input signal referred to as CLK IN. PLL 402 drives a further PLL 404, which in turn drives a clock divider 406. Prior to modification, the output signal generated by clock divider 406 is the clock signal provided to the circuit under test.

In implementing a user circuit design for debugging, host computing system 102 is capable of adding a clock enable 408. In the example shown in FIG. 4, clock enable 408 is implemented as an AND gate. The signal generated by clock divider 406 is provided to a first input of clock enable 408. A control signal "ECR6" provided from event control registers 114 is provided to a second input of clock enable 408. The output signal generated by clock enable 408 is provided as a clock signal to the circuit under test. With clock enable 408 inserted into the circuit design, LA controller 108 is capable of controlling the clock signal provided to the circuit under test. In the case where the circuit under test utilizes more than one clock signal, a clock enable can be inserted for each such different clock signal allowing each clock signal to be independently controlled.

For example, LA controller 108 is capable of stopping the clock signal (e.g., "gating" the clock signal) to the circuit under test (e.g., via command controller 110 and clock enable 122) so that the clock signal does not transition, stepping the clock signal, and/or causing the clock signal to free-run for a particular number of cycles. Further, command controller 110 may be coupled to the DRP, which allows command controller 110 to configure PLL 402, PLL 404, and/or clock divider 406 to change the frequency of the clock signal generated by clock controller 400 at any time during operation of IC 104. Command controller 110 is capable of running the clock for a predetermined number of cycles, stopping the clock signal, changing values of one or more debug signals, and starting the clock signal for another predetermined number of cycles.

In the example of FIG. 4, clock enable 408 is illustrated as an AND gate. In other embodiments, clock enable 408 may be implemented using a different circuit architecture than shown. Further, clock enable 408 is capable of operating to provide a glitch-free clock signal to the circuit under test. It should be appreciated that a clock enable can be inserted for each clock signal and/or clock domain of the circuit under test and each clock enable is controlled by LA controller 108.

Figure 5:
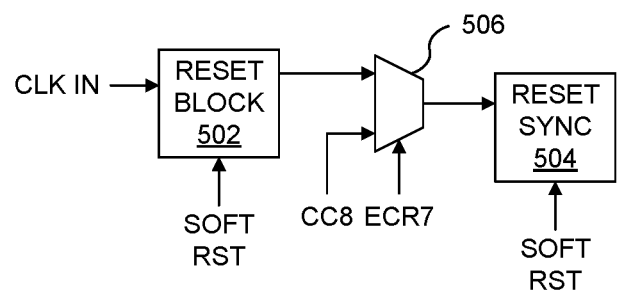
FIG. 5 illustrates an example of reset circuitry of a circuit under test modified for use with a logic analyzer controller.

FIG. 5 is an example of reset circuitry of the circuit under test modified for use with LA controller 108 of FIG. 1. In the example of FIG. 5, the reset circuitry for the circuit under test, in unmodified form, includes a reset block 502 and a reset sync 504. A soft reset (RST) signal is provided to each of reset block 502 and reset sync 504. Prior to modification, the output signal generated by reset block 502 is provided directly to the input of reset sync 504. The output from reset sync 504 is provided to the circuit under test as a reset signal.

In implementing a user circuit design for debugging, host computing system 102 is capable of adding a reset enable 506. In the example shown in FIG. 5, reset enable 506 is implemented as a multiplexer. Further, the EDA application couples the output signal generated by reset block 502 to a first input of reset enable 506 and a control signal labeled "CC8" from command controller 110 to a second input of reset enable 506. Host computing system 102 couples a control signal provided from event control registers 114 labeled "ECR7" to reset enable 506 as a select signal that causes reset enable 506 to pass the signal provided to the first input or the signal provided to the second input based upon the state of the select signal. The output signal passed by reset enable 506 is coupled to an input of reset sync 504. With reset enable 506 inserted into the circuit design, LA controller 108 is capable of controlling the reset signal(s) provided to the circuit under test. As discussed, LA controller 108 is capable of controlling reset signal(s) provided to the circuit under test on a per-module basis. In this regard, additional reset enables, e.g., a different reset enable, for each different module included in the circuit design under test.

Figure 6A:
FIGS. 6A and 6B illustrate example views provided within graphical user interfaces (GUIs) displayed by a host computing system.
Figure 6B:

FIGS. 6A and 6B illustrate example views provided within graphical user interfaces (GUIs) displayed by host computing system 102 of FIG. 1. In the examples of FIGS. 6A and 6B, a circuit under test is implemented within IC 104. Host computing system 102, in executing the runtime analyzer application and implementing the circuit under test and LA controller, is capable of displaying GUIs including different views of portions of the circuit under test. In the examples of FIGS. 6A and 6B, a user has selected "signal 1" of the circuit under test. Signal 1, for example, is a signal that was already designated for debugging during implementation of the user's circuit design. The user may select signal 1 from a larger visualization of the circuit design, from a netlist, or other representation of the circuit design.

In the example of FIG. 6A, a logical view of the input cone of signal 1 is illustrated. For example, in response to a user request to display detail relating to signal 1, host computing system 102, in executing the runtime analyzer application and implementing the circuit under test and LA controller, is capable of displaying the view of FIG. 6A within a GUI. The logical view of FIG. 6A shows one level of the input cone of signal 1.

In the example of FIG. 6B, host computing system 102, in executing the runtime analyzer application and implementing the circuit under test and LA controller, is capable of generating a technology mapped view of the selected signal. The technology mapped view shows the circuit element of the circuit under test that generates signal 1 and the circuit element of the circuit under test that receives signal 1 as an input. In the example of FIG. 6B, the circuit element that generates signal 1 is a lookup table shown as LUT4.

For purposes of illustration, the runtime analyzer application may include a default setting that specifies a number of logic levels to be displayed in response to selecting a particular signal. Referring to the examples of FIGS. 6A and 6B, the default logic level may be specified as one. Accordingly, host computing system 102, in executing the runtime analyzer application and implementing the circuit under test and LA controller, displays one logic level of the input cone for the selected signal. In one or more other embodiments the user may specify a particular number of levels as part of selecting a signal. In that case, rather than using the default number of logic levels, the system displays a number of logic levels of the input cone specified by the user.

In providing a request to view the input cone, the user may further indicate whether the logical view or the technology mapped view is desired. Host computing system 102, in executing the runtime analyzer application and implementing the circuit under test and LA controller, is capable of generating either type of view depending upon which view is requested by the user. Further, the user may request a logical view or a technology mapped view of the output cone of the selected signal. The number of logic levels of the output cone may be the default number of logic levels or a different user-specified number of logic levels.

Figure 7A:
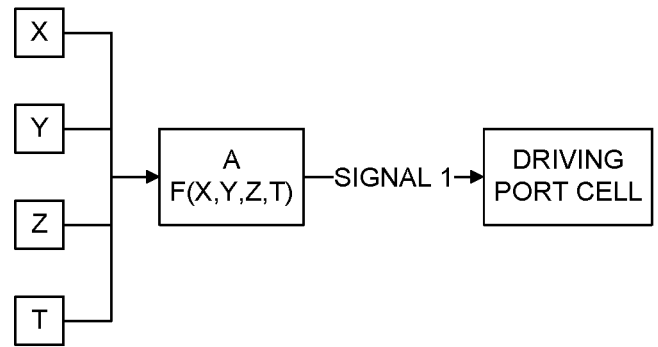
FIGS. 7A and 7B illustrate example views provided within GUIs displayed by a host computing system.
Figure 7B:
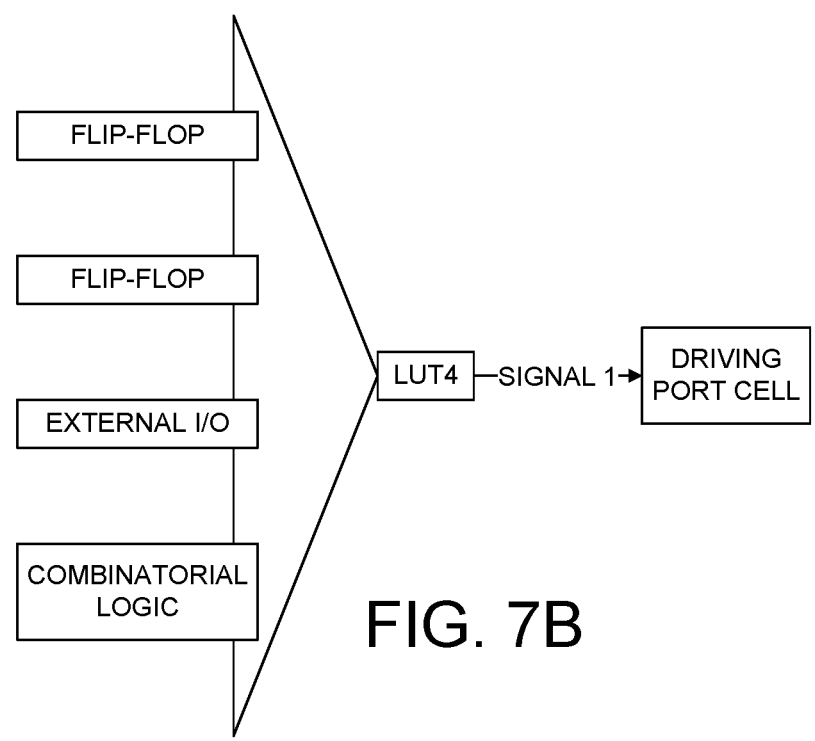

FIGS. 7A and 7B illustrate additional example views provided within GUIs displayed by host computing system 102 of FIG. 1. In the examples of FIGS. 7A and 7B, the user has requested two logic levels of the input cone of the selected signal as opposed to one logic level. FIG. 7A illustrates the logical view of the two logic levels of the input cone and illustrates the logical signal names entering into the block that outputs signal 1. FIG. 7B illustrates the technology mapped view of the two logic levels of the input cone.

Figure 8:
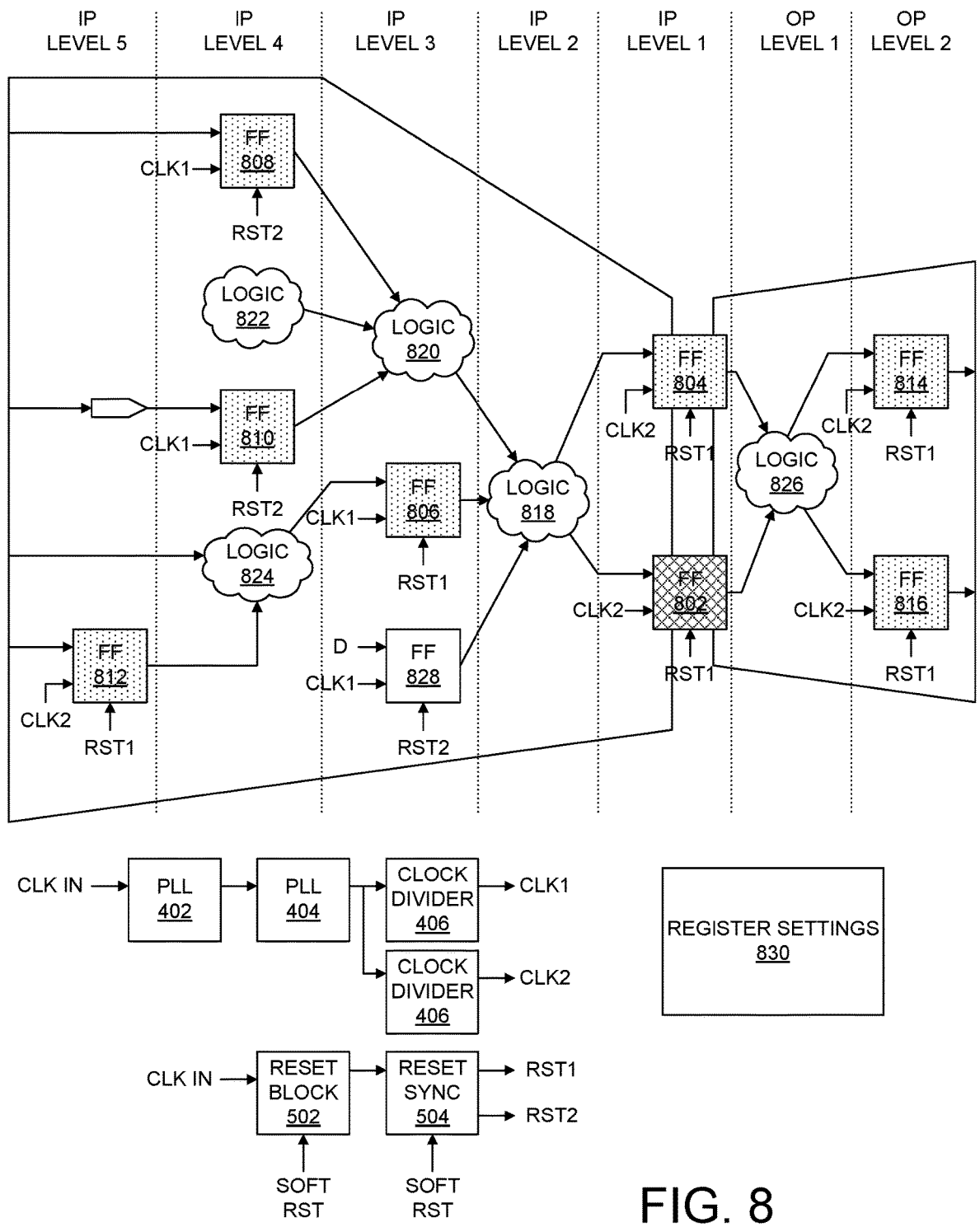
FIG. 8 illustrates another example view provided within a GUI displayed by a host computing system.

FIG. 8 illustrates another example of a view provided within a GUI displayed by host computing system 102 of FIG. 1. FIG. 8 is an example of a consolidated view of a portion of a circuit design that shows inputs (e.g., data), clock signals, resets, and enables. Host computing system 102, in executing the runtime analyzer application, is capable of displaying a view of any number of logic levels of the input cone that contributes the functionality of a selected signal. In this example, the selected signal is a debug signal. Host computing system 102 is also capable of displaying a view of any number of logic levels of the output cone that is propagated to other signals (e.g., debug signals) from the selected signal. In one or more embodiments, signals are selected, whether for designation as probed and/or debug signals or for generating views of input and/or output cones by selecting the signal itself (e.g., a visualization of the signal in a circuit diagram) or by selecting a circuit element in such a visualization that is coupled to the desired signal. For example, a user may select the signal provided to flip-flop 802 by selecting the signal itself or selecting an input of flip-flop 802.

In the example of FIG. 8, flip-flop 802, shown with cross-hatching, has been selected as a signal under debug (in reference to the signal provided to flip-flop 802 as an input). Accordingly, command controller 110 is capable of injecting a value into flip-flop 802 though such circuitry is not shown in FIG. 8. The view of FIG. 8 illustrates, as requested by the user, five logic levels of the input cone to flip-flop 802 and two logic levels of the output of flip-flop 802. Flip-flops 804, 806, 808, 810, 812, 814, and 816, shown with shading, are selected for data capture. Accordingly, the values of input signals to each of flip-flops 804-812 are captured by LA controller 108 within IC 104 and may be output to host computing system 102. Flip-flops 804-812 are in various logic levels of the input cone of flip-flop 802. Flip-flops 814 and 816 are in logic level 2 of the output cone of flip-flop 802.

The view of FIG. 8 further illustrates different portions of logic 818, 820, 822, 824, and 826. As illustrated, portions of logic 818-824 are in various logic levels of the input cone of flip-flop 802. Portions 824-826 are in various logic levels of the output cone of flip-flop 802.

The view of FIG. 8 further illustrates the clock circuitry with the resulting clock signals CLK1 and CLK2. The view of FIG. 8 shows which clock signals drive the respective circuit elements shown. For purposes of illustration, additional clock circuitry added by the EDA application for purposes of allowing LA controller 108 to control the circuit under test is not illustrated within FIG. 8.

The view of FIG. 8 further illustrates the reset circuitry with the resulting reset signals RST1 and RST2. The view of FIG. 8 shows which reset signals are provided to the respective circuit elements shown. For purposes of illustration, additional reset circuitry added by the EDA application for purposes of allowing LA controller 108 to control the circuit under test is not illustrated within FIG. 8.

In one or more embodiments, the view of FIG. 8 also includes region 830. Region 830 displays register settings that control the clock and/or reset signals of clock controller 120 and/or reset controller 124. As an illustrative and nonlimiting example, region 830 displays register settings of clock and/or PLL controllers (e.g., hard blocks) of the IC. In particular embodiments, the user may enter new or updated values within region 830. In response to receiving user inputs within region 830, host computing system 102 is capable of configuring clock controller 120 and/or reset controller 124 of IC 104 with the user provided settings. For example, host computing system 102 generates one or more command that are sent to the LA controller 108 to update settings in PLL 402, PLL 404, clock divider 406, clock divider 406, reset block 502, and/or reset sync 504.

Figure 9:
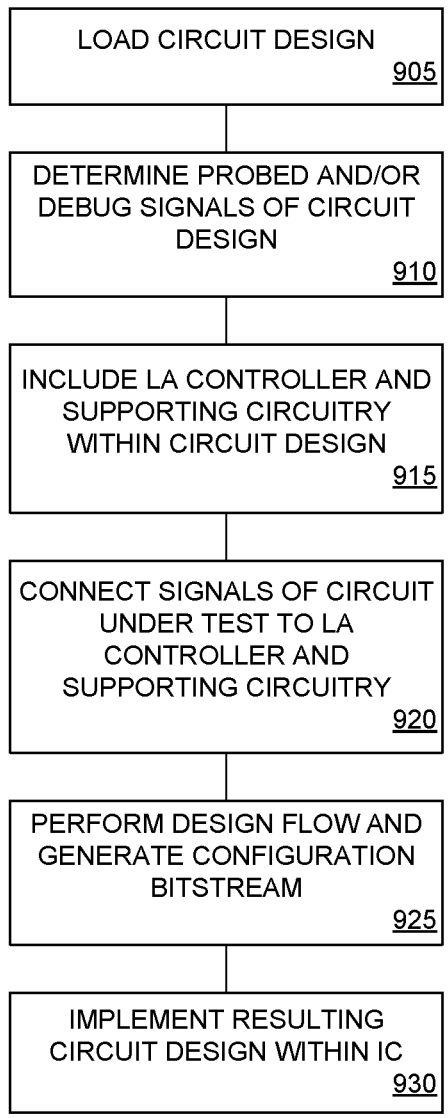
FIG. 9 illustrates an example method of debugging a circuit.

FIG. 9 illustrates an example method 900 of debugging a circuit. Method 900 may be performed by a system such as host computing system 102 of FIG. 1.

In block 905, the system loads a circuit design. The circuit design may be a user circuit design that is to be debugged as implemented within an IC.

In block 910, the system determines the probed signal(s) and/or debug signal(s) of the circuit design. In one or more embodiments, the user provides inputs to the system that select each signal to be probed and whether such signal is to be a debug signal. In block 915, the system includes the LA controller and supporting circuitry within the circuit design. For example, in addition to the LA controller, the system includes clock control circuitry as described in connection with FIG. 4. The system includes reset control circuitry as described in connection with FIG. 5. The system includes circuitry that allows the LA controller to push data onto the selected debug signals.

In block 920, the system connects signals of the circuit under test to the LA controller and the supporting circuitry. For example, the system connects the probed signals and the debug signals of the circuit design (under test) to the LA controller. The system also connects debug signals generated by the LA controller with the clock controller, the clock enable, and the reset enable.

In block 925, the system performs a design flow on the circuit design and generates a configuration bitstream. In one or more embodiments, the system parses the RTL of the circuit design and collects information about the logical cones (input/output), number of levels, clock topology, and reset topology relating to each of the signals determined in block 910. The system is also capable of collecting information relating to the different views available (e.g., logical and technology mapped). For example, the system is capable of saving a mapping of logical elements to physical circuit components on the target IC for purposes of generating a technology mapped view. The system is further capable of storing such data after each different phase of the design flow, e.g., after synthesis, placement, and routing. The system saves the logical cone, levels, clock topology, reset topology, and view information for later use. The information may be used, for example, during implementation of the circuit design, by the runtime analyzer, or by other EDA design tools.

In block 930, the system implements the resulting circuit design in the IC. For example, the system loads the configuration bitstream into the IC. Block 930 physically implements an architecture as described in connection with FIG. 1 within the IC.

Figure 10:
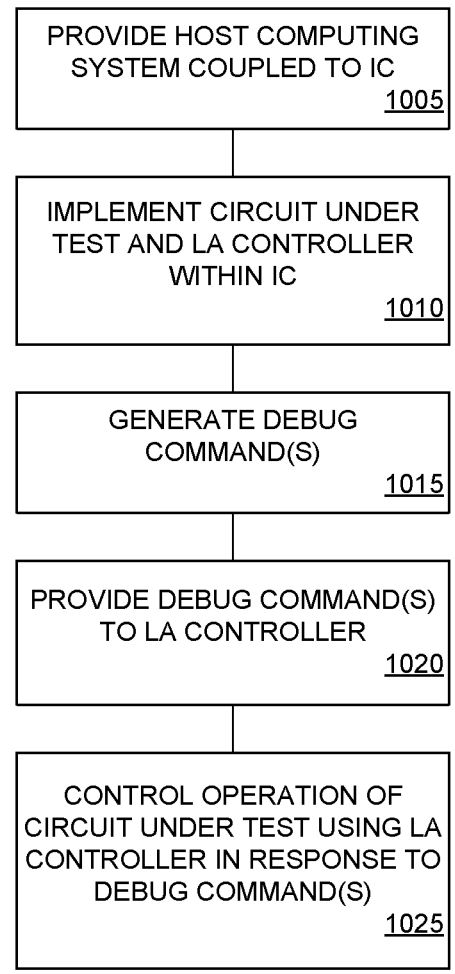
FIG. 10 illustrates another example method of debugging a circuit.

FIG. 10 illustrates another example method 1000 of debugging a circuit. Method 1000 may be performed using the debug system as described in connection with FIG. 1.

In block 1005, a system (e.g., a host computing system) is provided. The system is coupled to an IC in which a circuit under test is to be implemented. In block 1010, the system implements the circuit under test and LA controller within the IC. For example, having inserted the LA controller within the circuit design, creating the interface circuitry, and connecting signals, the system is capable of performing a design flow on the circuit design. The system is capable of synthesizing, placing, routing, and generating a configuration bitstream for the circuit design. The system is capable of loading the configuration bitstream into the IC thereby physically implementing the circuit under test and the LA controller within the IC. For example, an architecture as described in connection with FIG. 1 is implemented within the IC.

In block 1015, the system generates one or more debug commands. For example, the system receives user inputs specifying desired debugging actions such as starting and/or stopping the clock, resetting the circuit design, pushing values onto debug signals, stepping the clock, and/or free running the clock for a specified number of cycles. The system generates debug commands that implement the user requested actions.

In one or more embodiments, the system debug commands are capable of restarting debugging. The debug commands may specify a trigger condition (a same or different trigger condition) and sending the trigger condition to the LA controller. As an illustrative and nonlimiting example, the user may specify an event such as signal A and signal B appearing with selected values a particular number of times. The user event may be programmed into the TDD port and the event control registers to define a trigger condition. When started, the LA controller looks for the condition specified in the TDD port for the number of instances or occurrences specified in the event control registers. In response to detecting the condition the enumerated number of times, the LA controller is capable of continuing with other operations such as detecting a further or different user-defined event from the event control registers, receiving a new and/or updated user-defined event from the host computing system for detection, or starting anew to detect the occurrence of the prior user-defined event again. For example, the commands may reset the LA controller to begin detecting a new trigger condition or an existing trigger condition anew.

In block 1020, the system provides the debug command(s) to the LA controller within the IC. For example, the system sends the debug command(s) to the IC interface, which provides the commands to the command controller. The command controller configures the other blocks of the LA controller such as the event control registers and the TDD port. In block 1025, the LA controller controls operation of the circuit under test in response to the received debug command(s) received from the system. For example, in response to receiving the debug command(s), the command controller and the event control registers are capable of generating control signals to control the clock circuitry, the reset circuitry, and/or to push value(s) onto the debug signals. As discussed, the LA controller is capable of controlling the circuit under test in real time or substantially real time in response to the received debug commands.

In controlling operation of the circuit under test, the LA controller is capable of bringing the circuit under test to a known state. For example, the LA controller is capable of resetting the circuit design using the reset circuitry and/or pushing desired values onto any of the debug signals of the circuit under test. In another example, the LA controller is capable of reducing the frequency of operation of the circuit under test by lowering the frequency of the clock signal to determine whether the circuit operates as expected at the lower clock frequency. In another example, the LA controller is capable of increasing the frequency of operation of the circuit under test by increasing the frequency of the clock signal to determine whether the circuit operates as expected at the higher clock frequency.

In one or more embodiments, the LA controller is capable of pushing data onto debug signals by first stopping or gating the clock signal provided to the circuit under test using the clock enable. With the clock signal gated, the LA controller can push desired values onto the debug signals, thereby overriding or overwriting value(s) previously on the debug signals. For example, the LA controller is capable of providing desired values on the CC signals and causing the inserted multiplexers to pass the CC signal by providing the appropriate ECR signals as select signals. The LA controller then can restart the clock signal. To observe how the circuit under test consumes and/or processes the injected value(s), the LA controller can restart the clock signal. In restarting the clock signal, the LA controller is capable of stepping the clock signal one cycle at a time (e.g., in response to debug commands stepping the clock signal), restarting the clock signal without constraint, or allowing the clock signal to free run for a specified number of cycles (e.g., in response to debug commands specifying restarting the clock signal for a specified number of cycles). In this example, the debugging allows behavior of the circuit under test to be observed despite incorrect values being specified on debug signals since other correct values may be injected so that the circuit under test may continue operating from that point on with correct signal values. The circuit under test need not be reimplemented to continue testing and/or debugging.

In one or more embodiments, the host computing system, operating under control of the user, is capable of writing data to the event control registers. The outputs from the event control registers can also be used as flag signals provided to the circuit under test as described herein. Further, the outputs from the event control registers are visible to the user within the runtime analyzer application in real time or in substantially real time. Through the runtime analyzer application, the user is capable of setting, resetting, and/or counting the flags and using the flags as a trigger condition in the TDD port to capture data from the probed signals or selected probed signals.

Figure 11:
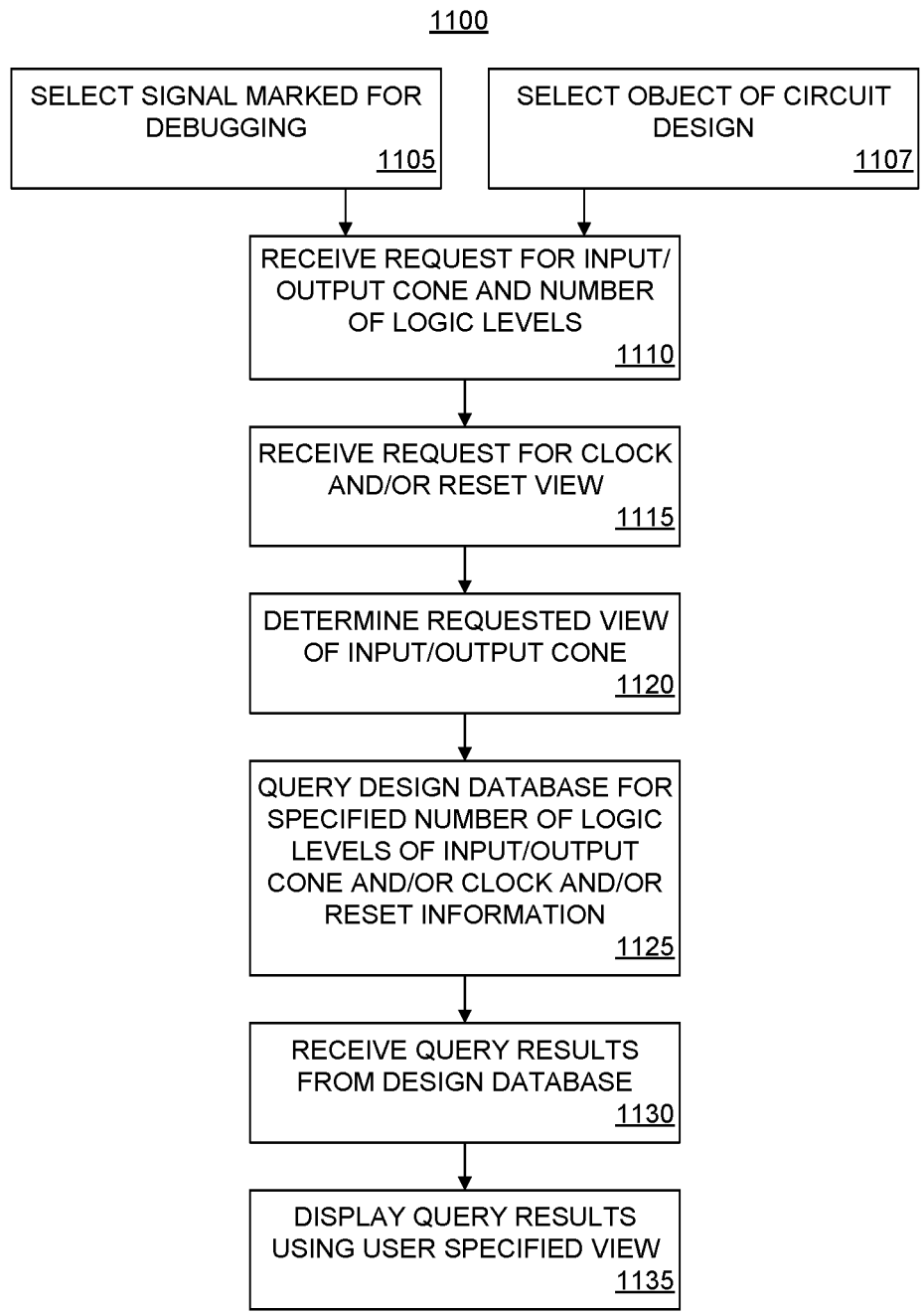
FIG. 11 illustrates another example method of evaluating a circuit and/or circuit design.

FIG. 11 illustrates another example method 1100 of evaluating a circuit and/or circuit design. Method 1100 can be implemented in a number of different contexts. In one aspect, a system (e.g., a data processing system) executing a runtime analyzer is capable of implementing method 1100 for purposes of debugging a user circuit design that is implemented in an IC. In another aspect, method 1100 can be implemented by a system executing an EDA application for purposes of analysis of a user circuit design without implementing the user circuit design within the IC. Accordingly, method 1100 includes a first entry point corresponding to block 1105, which corresponds to debugging in the case where the user circuit design is implemented in an IC, and a second entry point corresponding to block 1107, which corresponds to the EDA application context where the user circuit design is not implemented in the IC.

In block 1105, the system selects a signal marked for debugging. In the path corresponding to block 1105, method 1100 begins in a state where the user has incorporated the LA controller within a circuit design and implemented the circuit design within an IC as described herein and generally illustrated in connection with FIG. 1. The system is capable of receiving one or more user inputs that select a debug signal of the circuit under test, e.g., a signal of the circuit design already selected by the user for debugging and implemented within the IC as a debug signal. For example, the runtime analyzer application is capable of accessing the design database for the circuit design now implemented within the IC. The design database can include the circuit design (e.g., hardware description language and/or netlist), the elaborated netlist, and/or synthesis, placement, routing, and/or other implementation information for the circuit under test. During debugging, while the circuit under test is implemented within the IC, the user is able to observe signals marked for debugging within the runtime analyzer application. The user is able to obtain additional information for the source cells that drive the selected debug signal.

In block 1107, the system selects an object of the circuit design for analysis. In the path corresponding to block 1107, method 1100 need not implement the user circuit design and LA controller in the IC. The path through block 1107 allows a user to perform a same or similar analysis without having to physically implement the architecture described in connection with FIG. 1 within an IC. In block 1107, for example, the system is capable of receiving a user input selecting an object, e.g., a signal or other circuit block, for analysis. The user input may specify the object within a programming language specification that is to be converted into a circuit design through high-level synthesis, from an elaborated netlist, from a synthesized netlist, or at any other stage of the design flow.

For purposes of description, for the remainder of FIG. 11, the term "object" is used to refer to the user selected item, whether a debug signal as selected in block 1105 or an object of the circuit design as selected in block 1107.

In block 1110, the system receives a request for an input cone and/or an output cone for the selected object. The system, for example, receives an input requesting the display of the input and/or the output cone of the selected object. The request may specify the number of logic levels of the input cone and/or the output cone that are to be displayed within the GUI generated by the system. If a number of logic levels is not directly specified, the system may utilize a default number of logic levels.

In block 1115, the system optionally receives a request for a clock view and/or a reset view for the circuit under test.

In block 1120, the system determines the type of view of the input/output cone requested by the user. As discussed, the view may be a logical view or a technology mapped view. In the case of a technology mapped view, the particular view specified further may indicate a particular stage of the design flow such as after synthesis, after placement, or after routing. In particular embodiments, the system receives a further user input specifying the depth of the input and/or output cone (e.g., number of logic levels) to be displayed in the input and/or output cone as part of block 1120.

In block 1125, the system queries the design database for a specified number of levels, e.g., the specified depth, of the input and/or output cone of the selected object as requested by the user. The system further is capable of querying the design database for clock and/or reset signal information for the circuit and/or circuit design. The portion of the design database queried may depend upon the particular view requested by the user. For example, in the case where the requested view is a logical view, the system may query the elaborated netlist portion of the design database. In the case where the requested view is the technology mapped view, the system may query the synthesis information for the circuit design, the placement information for the circuit design, and/or routing information for the circuit design. In other embodiments, each different type of data may be stored in a different database so that the particular database that is queried (e.g., elaborated design database, synthesis database, placement database, routing database) varies based upon the view that is chosen.

In block 1130, the system receives the query results from the design database. In block 1135, the system displays the query results using the user-specified view. For example, the system is capable of generating a view that is displayed within a GUI as described in connection with FIG. 6. The GUI generated by the system provides a consolidated view showing probe signals, the selected debug signal(s), and clocking and/or reset signals provided to the circuitry of the input/output cone shown in the view. The view further is capable of visually differentiating those circuit elements corresponding to probe signals, from circuit elements corresponding to debug signals, from other circuitry of the circuit under test as illustrated in the example of FIG. 6.

In one or more other embodiments, the system is capable of generating other views that may be displayed within a GUI. For example, the system is capable of generating a clock view showing only configuration data and register values that affect the clocking circuitry. The system is capable of generating a reset view showing only signals and/or registers that affect the reset topology of the circuit under test.

As discussed, in one aspect, through the entry point of block 1105, the example of FIG. 11 is performed by a system executing a runtime analyzer application. In that case, the system is capable of displaying information as generally described herein and illustrated in the examples of FIGS. 6, 7, and/or 8 when the user is using the runtime analyzer application in coordination with the architecture of FIG. 1 implemented within an IC. In another aspect, through the entry point of block 1107, the example of FIG. 11 is performed by a system executing an EDA application. In that case, the system is capable of displaying information as generally described herein and illustrated in the examples of FIGS. 6, 7, and/or 8 when the user is using the EDA application without implementing the architecture described in connection with FIG. 1 within the IC. As such, the functionality described herein is made available to the user whether using a runtime analyzer application for purposes of debug and/or an EDA application during the design process.

For example, in response to a user request, the system, whether executing an EDA application or the runtime analyzer application in coordination with the IC, is capable of displaying any specified object of the circuit (e.g., signal, element, debug signals, and/or circuits). Whether executing an EDA application or a runtime analyzer application in coordination with the IC, in response to a user request, the system is capable of displaying any number of logical levels of an input cone that contributes to the functionality of a selected object, e.g., a signal, with or without hierarchies. Similarly, whether executing an EDA application or the runtime analyzer application in coordination with the IC, in response to a user request, the system is capable of displaying any number of logical levels of an output cone of a selected object, e.g., a signal, that is propagated to other objects. Whether executing an EDA application or the runtime analyzer application in coordination with the IC, in response to a user request, the system is capable of displaying the clock structure or topology and/or the reset structure or topology of the entire circuit design, the selected object, or for the input and/or output cone that is displayed.

For example, from within the EDA application or the runtime analyzer application, the user can select one or more signals from the circuit under test. The user further may right-click and select the input cone or the output cone for each selected signal. The user may also right-click and select a number of levels or depth of the input cone or the output cone to be displayed. The user further may right click and specify either the logical view from the elaborated netlist or the technology mapped view from the implemented netlist.

As an illustrative and nonlimiting example, in response to the user specifying the foregoing information, the system displays a view such as that illustrated in FIG. 6 for the selected signal. In response to a further user input, e.g., a selection or double-click on the circuit element displayed, the system presents a view as illustrated in the example of FIG. 7. In particular embodiments, the user may provide a further user input such as a right-click and select the reset/clock/enable topology of the selected node or the complete design. In response, the system displays the reset/clock/enable topology of the complete design. This functionality of the system allows the user to view input and/or output cones for any signals of interest and further view the other circuit elements and/or signals that influence the signals of interest. These operations may be performed using an EDA application (e.g., when not debugging a physical circuit) or using the runtime analyzer (while debugging a physical circuit).

The example user interfaces and views described herein provide improved control over analysis and/or debug operations that are initiated from and performed under the control of the host computing system. Within the user interfaces, the signals that influence particular input cones and/or output cones up to a user specified depth can be viewed in order to determine the areas of the circuitry and/or circuit design that require further analysis and/or debugging.

Figure 12:
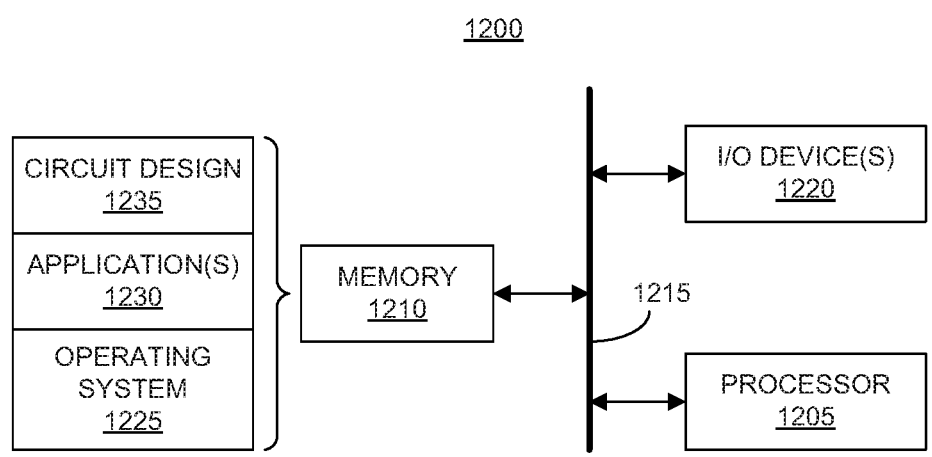
FIG. 12 illustrates an example implementation of a host computing system.

FIG. 12 illustrates an example implementation of host computing system 102 of FIG. 1. System 1200 of FIG. 12 is an example of computer hardware that may be used to implement any of a variety of different computers, servers, portable computers such as laptops or tablet computers, or other data processing systems.

In the example of FIG. 1, system 1200 includes at least one processor 1205. Processor 1205 is coupled to memory 1210 through interface circuitry 1215. System 1200 is capable of storing computer readable instructions (also referred to as "program code") within memory 1210. Memory 1210 is an example of computer readable storage media. Processor 1205 is capable of executing the program code accessed from memory 1210 via interface circuitry 1215.

Memory 1210 may include one or more physical memory devices such as, for example, a local memory and a bulk storage device. Local memory refers to non-persistent memory device(s) generally used during actual execution of program code. Examples of local memory include random access memory (RAM) and/or any of the various types of RAM that are suitable for use by a processor during execution of program code (e.g., dynamic RAM or "DRAM" or static RAM or "SRAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. System 1200 may also include one or more cache memories (not shown) that provide temporary storage of at least some program code in order to reduce the number of times program code must be retrieved from a bulk storage device during execution.

Memory 1210 is capable of storing program code and/or data. For purposes of illustration, memory 1210 stores an operating system 1225, one or more application(s) 1230, and a circuit design 1235 corresponding to the circuit under test.

In one or more embodiments, application(s) 1230 include the EDA application and/or the runtime analyzer application.

System 1200, e.g., processor 1205, is capable of executing operating system 1225 and application(s) 1230 to perform the operations described within this disclosure. As such, operating system 1225 and application(s) 1230 may be considered an integrated part of system 1200. Further, it should be appreciated that any data used, generated, and/or operated upon by system 1200 (e.g., processor 1205) are functional data structures that impart functionality when employed as part of the system.

Examples of interface circuitry 1215 include, but are not limited to, a system bus and an input/output (I/O) bus. Interface circuitry 1215 may be implemented using any of a variety of bus architectures. Examples of bus architectures may include, but are not limited to, Enhanced Industry Standard Architecture (EISA) bus, Accelerated Graphics Port (AGP), Video Electronics Standards Association (VESA) local bus, Universal Serial Bus (USB), and Peripheral Component Interconnect Express (PCIe) bus.

System 1200 further may include one or more I/O devices 1220 coupled to interface circuitry 1215. I/O devices 1220 may be coupled to system 1200, e.g., interface circuitry 1215, either directly or through intervening I/O controllers. Examples of I/O devices 1220 include, but are not limited to, a keyboard, a display device, a pointing device, one or more communication ports, and a network adapter. A network adapter refers to circuitry that enables system 1200 to become coupled to other systems, computer systems, remote printers, and/or remote storage devices through intervening private or public networks. Modems, cable modems, Ethernet cards, and wireless transceivers are examples of different types of network adapters that may be used with system 1200.

System 1200 may include fewer components than shown or additional components not illustrated in FIG. 12 depending upon the particular type of device and/or system that is implemented. In addition, the particular operating system, application(s), and/or I/O devices included may vary based upon system type. Further, one or more of the illustrative components may be incorporated into, or otherwise form a portion of, another component. For example, a processor may include at least some memory. System 1200 may be used to implement a single computer or a plurality of networked or interconnected computers each implemented using the architecture of FIG. 12 or an architecture similar thereto.

ICs can be implemented to perform a variety of functions. Some ICs can be programmed to perform specified functions. One example of an IC that can be programmed is an FPGA. An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Figure 13:
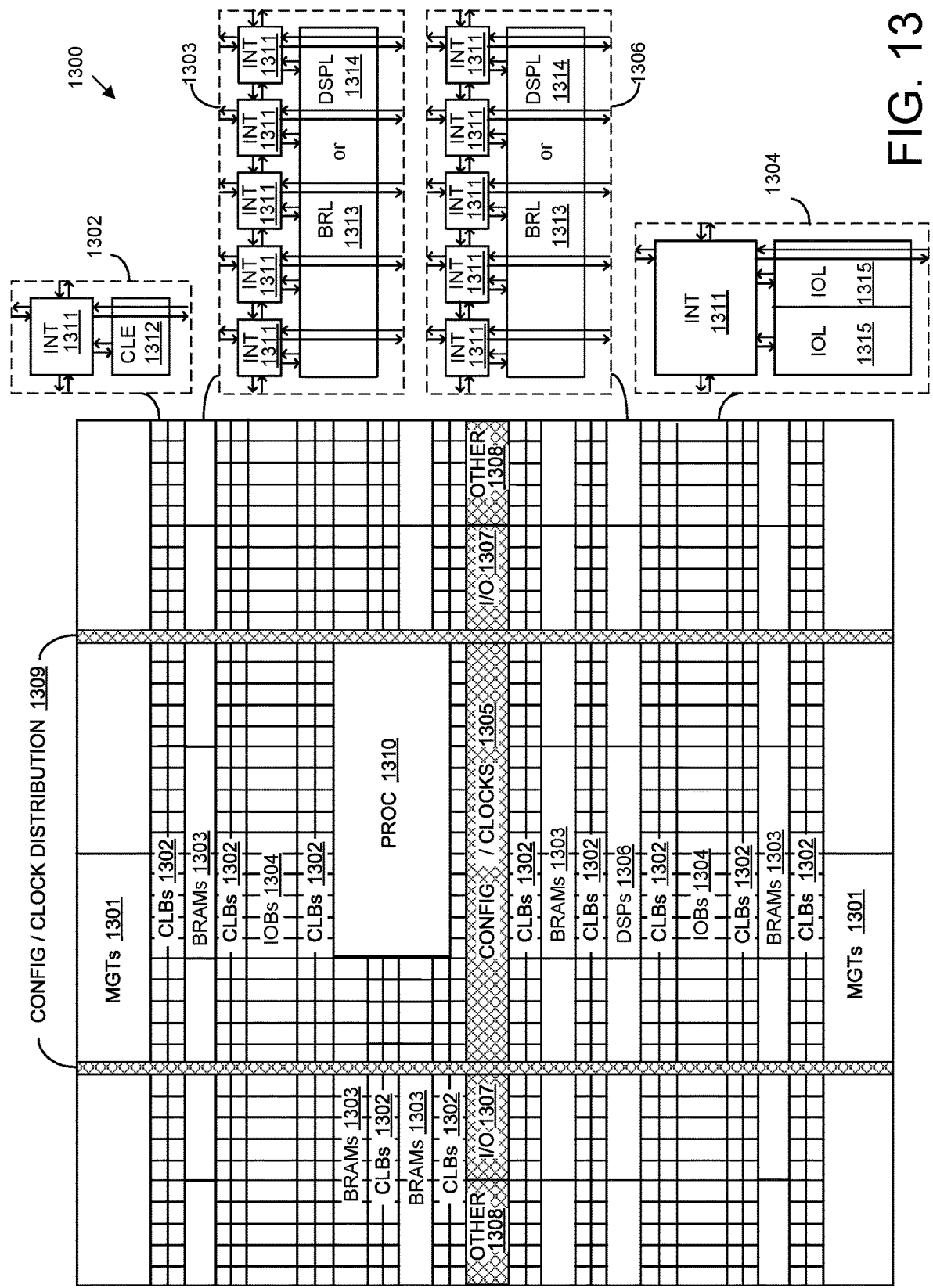
FIG. 13 illustrates an example architecture for an IC.

FIG. 13 illustrates an example architecture 1300 for an IC. In one or more embodiments, architecture 1300 or another architecture similar thereto, is used to implement IC 104 of FIG. 1.

In one aspect, architecture 1300 is implemented within a programmable IC. For example, architecture 1300 may be used to implement an FPGA. In another aspect, architecture 1300 is representative of a System-on-Chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1300 includes several different types of programmable circuit, e.g., logic, blocks. For example, architecture 1300 may include a large number of different programmable tiles including multi-gigabit transceivers (MGTs) 1301, configurable logic blocks (CLBs) 1302, random access memory blocks (BRAMs) 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, and so forth.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the top of FIG. 13.

For example, a CLB 1302 may include a configurable logic element (CLE) 1312 that may be programmed to implement user logic plus a single INT 1311. A BRAM 1303 may include a BRAM logic element (BRL) 1313 in addition to one or more INTs 1311. Typically, the number of INTs 1311 included in a tile depends on the height of the tile. As pictured, a BRAM tile has the same height as five CLBs, but other numbers (e.g., four) also may be used. A DSP tile 1306 may include a DSP logic element (DSPL) 1314 in addition to an appropriate number of INTs 1311. An 10B 1304 may include, for example, two instances of an I/O logic element (IOL) 1315 in addition to one instance of an INT 1311. The actual I/O pads connected to IOL 1315 may not be confined to the area of IOL 1315.

In the example pictured in FIG. 13, a columnar area near the center of the die, e.g., formed of regions 1305, 1307, and 1308, may be used for configuration, clock, and other control logic. Horizontal areas 1309 extending from this column may be used to distribute the clocks and configuration signals across the breadth of the programmable IC.

Some ICs utilizing the architecture illustrated in FIG. 13 include additional logic blocks that disrupt the regular columnar structure making up a large part of the IC. The additional logic blocks may be programmable blocks and/or dedicated circuitry. For example, a processor block depicted as PROC 1310 spans several columns of CLBs and BRAMs.

In one aspect, PROC 1310 may be implemented as dedicated circuitry, e.g., as a hardwired processor, that is fabricated as part of the die that implements the programmable circuitry of the IC. PROC 1310 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1310 may be omitted from architecture 1300 and replaced with one or more of the other varieties of the programmable blocks described. Further, such blocks may be utilized to form a "soft processor" in that the various blocks of programmable circuitry may be used to form a processor that can execute program code as is the case with PROC 1310.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 13 that are external to PROC 1310 such as CLBs 1302 and BRAMs 1303 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1310.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1310 or a soft processor. In some cases, architecture 1300 includes a dedicated configuration processor that loads the configuration bitstream to the appropriate configuration memory and/or processor memory. The dedicated configuration processor does not execute user-specified program code. In other cases, architecture 1300 may utilize PROC 1310 to receive the configuration bitstream, load the configuration bitstream into appropriate configuration memory, and/or extract program code for execution.

FIG. 13 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 13 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1310 within the IC are for purposes of illustration only and are not intended as limitations.

In one or more other embodiments, the IC used to implement the various circuit blocks described in connection with FIG. 1 may be an application-specific IC (ASIC). Further, IC architectures that include at least some programmable circuitry may be used.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a system for debugging circuits includes an IC configured to implement a circuit under test and a logic analyzer controller coupled to the circuit under test. The system includes a host computing system configured to communicate with the logic analyzer controller and provide a debug command to the logic analyzer controller. The logic analyzer controller, in response to the debug command, controls operation of the circuit under test.

In an aspect, the IC includes a reset controller coupled to the circuit under test and the logic analyzer controller. The reset controller is configured to generate a reset signal to the circuit under test in response to control signals provided from the logic analyzer controller.

In another aspect, the reset controller is configured to generate reset signals on a per module basis for the circuit under test.

In another aspect, the IC includes a clock controller coupled to the circuit under test and the logic analyzer controller. The clock controller is configured to provide a clock signal to the circuit under test in response to control signals provided from the logic analyzer controller.

In another aspect, the IC includes a clock enable circuit configured to receive the clock signal from the clock controller, provide the clock signal to the circuit under test, and selectively gate the clock signal in response to the control signals provided from the logic analyzer controller.

In another aspect, the logic analyzer controller is configured to control a clock signal provided to the circuit under test in response to the debug command.

In another aspect, the logic analyzer controller is configured to change a clock frequency of a clock signal provided to the circuit under test in response to the debug command.

In another aspect, the logic analyzer controller is configured to drive a value specified by the debug command onto a data signal of the circuit under test in response to the debug command, wherein the value specified by the debug command overrides an existing value of the data signal.

In another aspect, the logic analyzer controller is configured to restart debugging in response to the debug command.

In another aspect, the host computing system is configured to display, on a display device and in response to a user selection of the signal, at least one of an input cone or an output cone of a signal of the circuit under test for a specified depth.

In another aspect, the host computing system is configured to display at least one of a clock hierarchy for the signal or a reset hierarchy for the signal.

In one or more embodiments, a method of debugging circuits includes implementing, within an IC, a circuit under test and a logic analyzer controller coupled to the circuit under test. The method includes providing a host computing system coupled to the IC, generating, using the host computing system, a debug command and providing the debug command to the logic analyzer controller. The logic analyzer controller controls operation of the circuit under test in response to the debug command.

In an aspect, the controlling operation of the circuit under test includes controlling a clock signal provided to the circuit under test in response to the debug command.

In another aspect, the controlling operation of the circuit under test includes changing a clock frequency of a clock signal provided to the circuit under test in response to the debug command.

In another aspect, the controlling operation of the circuit under test includes controlling a reset signal provided to the circuit under test in response to the debug command.

In another aspect, the controlling operation of the circuit under test includes driving a value specified by the debug command onto a data signal of the circuit under test in response to the debug command.

In another aspect, the controlling operation of the circuit under test includes restarting debugging in response to the debug command.

In another aspect, the method includes displaying a signal from the circuit under test on a display device of the host computing system and, in response to a user selection of the signal, displaying at least one of an input cone or an output cone of the selected signal within the circuit under test for a specified depth.

In another aspect, the method includes displaying at least one of a clock hierarchy for the signal or a reset hierarchy for the signal.

In another aspect, the input cone or the output cone of the selected signal is shown in a logical view or a technology mapped view.

In one or more embodiments, an IC includes a circuit under test and a logic analyzer controller coupled to the circuit under test. The logic analyzer controller is configured to receive a debug command from a host system and control operation of the circuit under test in response to the debug command.

In one aspect, in response to the debug command, the logic analyzer controller is configured to drive a value specified by the debug command onto a data signal of the circuit under test, wherein the value specified by the debug command overrides an existing value of the data signal.

In another aspect, the IC includes a reset controller coupled to the circuit under test and the logic analyzer controller, wherein in response to the debug command, the logic analyzer controller generates a control signal to the reset controller causing the reset controller to generate a reset signal to the circuit under test.

In another aspect, the reset controller is configured to generate reset signals on a per module basis for the circuit under test.

In another aspect, the IC includes a clock controller coupled to the circuit under test and the logic analyzer controller, wherein in response to the debug command, the logic analyzer controller generates a control signal to the clock controller causing the clock controller to provide a clock signal to the circuit under test, wherein a property of the clock signal is specified by the debug command.

In another aspect, the property of the clock signal is frequency.

In another aspect, the IC includes a clock enable circuit coupled to the circuit under test and the logic analyzer controller, wherein in response to the debug command, the logic analyzer controller generates a control signal to the clock enable circuit causing the clock enable circuit to gate a clock signal provided to the circuit under test.

In one or more embodiments, a method includes providing, within an IC, a circuit under test and a logic analyzer controller coupled to the circuit under test, receiving, by the logic analyzer controller, a debug command from a host system, and controlling, using the logic analyzer controller, operation of the circuit under test in response to the debug command.

In one aspect, the controlling operation of the circuit under test in response to the debug command includes driving a value specified by the debug command onto a data signal of the circuit under test, wherein the value specified by the debug command overrides an existing value of the data signal.

In another aspect, the controlling operation of the circuit under test in response to the debug command includes providing a reset signal to the circuit under test.

In another aspect, the controlling operation of the circuit under test in response to the debug command includes changing a setting of a clock controller to adjust a property of a clock signal provided to the circuit under test.

In another aspect, the property of the clock signal is frequency.

In another aspect, the controlling operation of the circuit under test in response to the debug command includes gating a clock signal provided to the circuit under test.

In another aspect, the controlling operation of the circuit under test in response to the debug command includes restarting debugging on the circuit under test.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A system, comprising:
    an integrated circuit configured to implement:
        a circuit under test;
        a logic analyzer controller coupled to the circuit under test;
        wherein the circuit under test is instrumented with multiplexer circuitry operable responsive to a control signal from the logic analyzer controller to pass a selected signal to a flip-flop of the circuit under test, wherein the selected signal is either a data signal of the circuit under test, or at least one of a scan input signal or a value provided from the logic analyzer controller;
    a host computing system configured to communicate with the logic analyzer controller and provide a debug command to the logic analyzer controller; and
    wherein the logic analyzer controller, in response to the debug command, controls operation of the circuit under test by providing the control signal and the value to the multiplexer circuitry.

2. The system of claim 1, wherein, in response to further debug commands, the logic analyzer controller is configured to gate a clock signal provided to the circuit under test, drive the value specified by the debug command to the flip-flop of the circuit under test, and, subsequent to the driving, start the clock signal.

3. The system of claim 1, wherein the value specified by the debug command overrides an existing value of the data signal.

4. The system of claim 1, wherein the logic analyzer controller is configured to restart debugging in response to the debug command.

5. The system of claim 1, wherein the host computing system is configured to display, on a display device and in response to a user selection of a signal, at least one of an input cone or an output cone of the signal of the circuit under test for a specified depth.

6. The system of claim 5, wherein the host computing system is configured to display at least one of a clock hierarchy for the signal or a reset hierarchy for the signal.

7. The system of claim 1, wherein the logic analyzer controller is configured to modify a frequency of a clock signal provided to the circuit under test in response to a further debug command by providing a control signal to a clock controller in the integrated circuit configured to generate the clock signal for the circuit under test.

8. An integrated circuit, comprising:
a circuit under test;
a logic analyzer controller coupled to the circuit under test;
wherein the circuit under test is instrumented with multiplexer circuitry operable responsive to a control signal from the logic analyzer controller to pass a selected signal to a flip-flop of the circuit under test, wherein the selected signal is either a data signal of the circuit under test, or at least one of a scan input signal or a value provided from the logic analyzer controller; and
wherein the logic analyzer controller is configured to receive a debug command from a host system and control operation of the circuit under test in response to the debug command by providing the control signal and the value to the multiplexer circuitry.

9. The integrated circuit of claim 8, wherein the value specified by the debug command overrides an existing value of the data signal.

10. The integrated circuit of claim 8, further comprising:
a reset controller coupled to the circuit under test and the logic analyzer controller, wherein in response to a further debug command, the logic analyzer controller generates a control signal to the reset controller causing the reset controller to generate a reset signal to the circuit under test.

11. The integrated circuit of claim 10, wherein the reset controller is configured to generate a plurality of reset signals on a per module basis for the circuit under test, and wherein the reset controller resets only selected ones of a plurality of modules of the circuit test based on the further debug command.

12. The integrated circuit of claim 8, further comprising:
a clock controller coupled to the circuit under test and the logic analyzer controller, wherein in response to a further debug command, the logic analyzer controller generates a control signal to the clock controller causing the clock controller to vary a frequency of a clock signal provided to the circuit under test.

13. The integrated circuit of claim 12, wherein the further debug command specifies an increase or a decrease in the frequency of the clock signal.

14. The integrated circuit of claim 8, further comprising:
a clock enable circuit coupled to the circuit under test and the logic analyzer controller, wherein in response to a further debug command, the logic analyzer controller generates a control signal to the clock enable circuit causing the clock enable circuit to gate a clock signal provided to the circuit under test.

15. A method, comprising:
instrumenting a circuit under test with multiplexer circuitry operable responsive to a control signal from a logic analyzer controller to pass a selected signal to a flip-flop of the circuit under test, wherein the selected signal is either a data signal of the circuit under test, or at least one of a scan input signal or a value provided from the logic analyzer controller;
providing, within an integrated circuit, the circuit under test and the logic analyzer controller coupled to the circuit under test;
receiving, by the logic analyzer controller, a debug command from a host system;
controlling, using the logic analyzer controller, operation of the circuit under test in response to the debug command by providing the control signal and the value to the multiplexer circuitry.

16. The method of claim 15, wherein the controlling operation of the circuit under test in response to the debug command comprises:
changing a setting of a clock controller to adjust a property of a clock signal provided to the circuit under test.

17. The method of claim 16, wherein the property of the clock signal is frequency that is increased or decreased responsive to the debug command.

18. The method of claim 15, wherein the controlling operation of the circuit under test in response to the debug command comprises:
gating a clock signal provided to the circuit under test.

19. The method of claim 15, wherein the controlling operation of the circuit under test in response to the debug command comprises:
restarting debugging on the circuit under test.

20. The method of claim 15, wherein the controlling operation of the circuit under test in response to the debug command comprises:
resetting one or more modules of the circuit under test.

* * * * *